(12) United States Patent
Kim et al.

(10) Patent No.: US 9,153,605 B2
(45) Date of Patent: Oct. 6, 2015

(54) THIN FILM TRANSISTOR ARRAY SUBSTRATE, ORGANIC LIGHT EMITTING DISPLAY DEVICE COMPRISING THE SAME, AND METHOD OF MANUFACTURING THE THIN FILM TRANSISTOR ARRAY SUBSTRATE

(75) Inventors: Dae-Woo Kim, Yongin (KR); Jong-Hyun Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/535,963

(22) Filed: Jun. 28, 2012

(65) Prior Publication Data

US 2013/0134424 A1 May 30, 2013

(30) Foreign Application Priority Data

Nov. 30, 2011 (KR) .................. 10-2011-0127226

(51) Int. Cl.
*H01L 27/12* (2006.01)
*H01L 27/32* (2006.01)

(52) U.S. Cl.
CPC .......... *H01L 27/1255* (2013.01); *H01L 27/124* (2013.01); *H01L 27/1259* (2013.01); *H01L 27/3276* (2013.01)

(58) Field of Classification Search
CPC ............ H01L 27/3262; H01L 27/3265; H01L 27/322; H01L 27/32656; H01L 27/124
USPC .......................................... 257/59, 99, 71, 72
See application file for complete search history.

(56) References Cited

U.S. PATENT DOCUMENTS

| 2011/0050648 A1* | 3/2011 | Lee et al. ........................ 345/175 |
| 2011/0108848 A1* | 5/2011 | Lee et al. .......................... 257/72 |
| 2012/0139000 A1* | 6/2012 | Lee et al. .......................... 257/99 |
| 2013/0001564 A1* | 1/2013 | Choi et al. ........................ 257/59 |
| 2013/0015456 A1* | 1/2013 | You .................................. 257/71 |

FOREIGN PATENT DOCUMENTS

| KR | 10-2002-0023540 A | 3/2002 |
| KR | 10-2006-0033240 A | 4/2006 |
| KR | 10-2010-008269 A | 8/2010 |
| KR | 10-2011-0051858 A | 5/2011 |
| KR | 10-2011-0090308 A | 8/2011 |

* cited by examiner

Primary Examiner — Eugene Lee
Assistant Examiner — Fang-Xing Jiang
(74) Attorney, Agent, or Firm — Robert E. Bushnell, Esq.

(57) ABSTRACT

A thin film transistor array substrate may include a thin film transistor including an active layer, a gate electrode, source and drain electrodes, a first insulation layer arranged between the active layer and the gate electrode, and a second insulation layer arranged between the gate electrode and the source and drain electrodes, a pixel electrode arranged on the first insulation layer and comprising the same material as the gate electrode, a capacitor comprising a first electrode arranged on the same layer as the active layer and a second electrode arranged on the same layer as the gate electrode, a pad electrode arranged on the second insulation layer and comprising the same material as the source and drain electrodes, a protection layer formed on the pad electrode, and a third insulation layer formed on the protection layer and exposing the pixel electrode.

20 Claims, 6 Drawing Sheets

THIN FILM TRANSISTOR ARRAY SUBSTRATE, ORGANIC LIGHT EMITTING DISPLAY DEVICE COMPRISING THE SAME, AND METHOD OF MANUFACTURING THE THIN FILM TRANSISTOR ARRAY SUBSTRATE

CLAIM OF PRIORITY

This application makes reference to, incorporates the same herein, and claims all benefits accruing under 35 U.S.C. §119 from an application earlier filed in the Korean Intellectual Property Office on the 30 of Nov. 2011 and there duly assigned Serial No. 10-2011-0127226.

BACKGROUND OF THE INVENTION

1. Field of the Invention

The present invention relates to a thin film transistor array substrate, an organic light emitting display device comprising the thin film transistor array substrate, and a method of manufacturing the thin film transistor array substrate.

2. Description of the Related Art

Flat panel display devices such as organic light emitting display devices or liquid crystal display devices include thin film transistors (TFTs), capacitors, wirings connecting the above circuit parts, etc. TFTs, capacitors, wirings, etc. are provided as micro-patterns formed on a substrate used for manufacturing a flat panel display device. The micro-patterns of the substrate are formed mainly by a photolithography process that transfers a pattern using a mask.

According to a photolithography process, photoresist is uniformly coated on a substrate on which a pattern is to be formed. The photoresist is exposed by an exposure apparatus such as a stepper. In the case of positive photoresist, exposed photoresist undergoes a development process. After the photoresist is developed, the pattern on the substrate is etched by using the remaining photoresist. After a pattern is formed, unnecessary photoresist is removed.

In the above process of transferring a pattern using a mask, a mask having a necessary pattern needs to be prepared so that costs for preparing a mask rise as the number of processes using a mask increases. Also, since the above-described many operations are needed, a manufacturing process becomes sophisticated, a manufacturing time is prolonged, and manufacturing costs rise.

SUMMARY OF THE INVENTION

The present invention provides a thin film transistor array substrate, an organic light emitting display device comprising the thin film transistor array substrate, and a method of manufacturing the thin film transistor array substrate.

According to an aspect of the present invention, a thin film transistor array substrate may include a thin film transistor including an active layer, a gate electrode, source and drain electrodes, a first insulation layer arranged between the active layer and the gate electrode, and a second insulation layer arranged between the gate electrode and the source and drain electrodes, a pixel electrode arranged on the first insulation layer and comprising the same material as the gate electrode, a capacitor comprising a first electrode arranged on the same layer as the active layer and a second electrode arranged on the same layer as the gate electrode, a pad electrode arranged on the second insulation layer and comprising the same material as the source and drain electrodes, a protection layer formed on the pad electrode, and a third insulation layer formed on the protection layer and exposing the pixel electrode.

The active layer may comprise a semiconductor material doped with ion impurities.

The pixel electrode may include transparent conductive oxide.

The transparent conductive oxide may comprise at least one selected from a group consisting of indium tin oxide (ITO), indium zinc oxide (IZO), zinc oxide (ZnO), indium oxide ($In_2O_3$), indium galium oxide (IGO), and aluminum zinc oxide (AZO).

The first electrode may comprise a semiconductor material doped with ion impurities.

A gap may be formed between an end portion of the pixel electrode and an end portion of the second insulation layer.

An end portion of the pixel electrode and An end portion of the third insulation layer may be overlapped each other.

A gap may be formed between an end portion of the second electrode and an end portion of the second insulation layer.

The third insulation layer may directly contact the first insulation layer in the gap.

The protection layer may be further formed on the source electrode and the drain electrode.

The pad electrode may comprise a plurality of metal layers having different electron mobility.

The plurality of metal layers may comprise a layer including molybdenum (Mo) and a layer including aluminum (Al).

The protection layer may comprise metal oxide or transparent conductive oxide.

The transparent conductive oxide may comprise at least one selected from a group consisting of indium tin oxide (ITO), indium zinc oxide (IZO), zinc oxide (ZnO), indium oxide ($In_2O_3$), indium galium oxide (IGO), and aluminum zinc oxide (AZO).

A gap may be formed between an end portion of the pad electrode and an end portion of the protection layer.

The third insulation layer may directly contact an upper surface of the pad electrode in the gap.

The gate electrode may comprise a first layer including transparent conductive oxide and a second layer including metal.

The gate electrode and the source and drain electrodes may comprise the same material.

According to another aspect of the present invention, an organic light emitting display device may include a thin film transistor including an active layer, a gate electrode, source and drain electrodes, a first insulation layer arranged between the active layer and the gate electrode, and a second insulation layer arranged between the gate electrode and the source and drain electrodes, a pixel electrode arranged on the first insulation layer and comprising the same material as the gate electrode, a capacitor comprising a first electrode arranged on the same layer as the active layer and a second electrode arranged on the same layer as the gate electrode, a pad electrode arranged on the second insulation layer and comprising the same material as the source and drain electrodes, a protection layer formed on the pad electrode, a third insulation layer formed on the protection layer and exposing the pixel electrode, an organic light emitting layer arranged on the pixel electrode, and an opposed electrode arranged on the organic light emitting layer.

The opposed electrode may be a reflection electrode for reflecting light irradiated from the organic light emitting layer.

According to another aspect of the present invention, a method of manufacturing a thin film transistor array substrate may include a first mask process of forming a semiconductor layer on a substrate and forming an active layer of a thin film transistor and a first electrode of a capacitor by patterning the semiconductor layer, a second mask process of forming a first insulation layer, forming a transparent conductive oxide layer and a first metal layer on the first insulation layer, and forming a pixel electrode, a gate electrode of the thin film transistor, and a second electrode of the capacitor by patterning the transparent conducive oxide layer and the first metal layer, a third mask process of forming a second insulation layer and forming openings in the second insulation layer to allow the second insulation layer to expose the pixel electrode, source and drain areas of the active layer, and the first electrode, a fourth mask process of forming a second metal layer and a protection layer on a resultant of the third mask process, forming a source electrode and a drain electrode respectively connected to the source area and the drain area, and a pad electrode, by patterning the second metal layer and the protection layer, and removing the first metal layer of the pixel electrode and the first metal layer of the second electrode, and a fifth mask process of forming a third insulation layer and forming openings in the third insulation layer to expose the pixel electrode.

After the second mask process, ion impurities may be doped into the source and drain areas.

In the third mask process, an opening of the second insulation layer may be formed to form a gap between an end portion of the pixel electrode and an end portion of the second insulation layer.

In the third mask process, an opening of the second insulation layer may be formed to form a gap between an end portion of the first electrode and an end portion of the second insulation layer.

The first metal layer and the second metal layer may be formed of the same material.

The second metal layer may comprise a plurality of metal layers having different electron mobility.

The protection layer may be formed of metal oxide or transparent conductive oxide.

The fourth mask process may comprise a first etch process for etching the first metal layer, the second metal layer, and the protection layer; and a second etch process for etching the protection layer.

An etchant to which oxalic acid or anti-metal corrosion agent is added may be used in the second etch process.

After the fourth mask process, ion impurities may be doped into the first electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
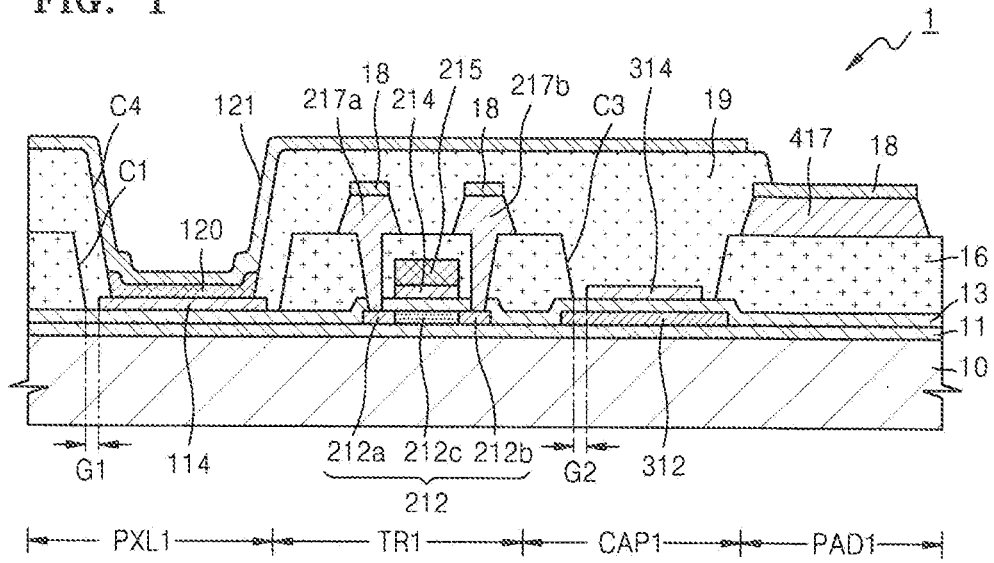
FIG. 1 is a cross-sectional view schematically illustrating an organic light emitting display device according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view schematically illustrating an organic light emitting display device 1 according to an embodiment of the present invention. Referring to FIG. 1, the organic light emitting display device 1 according to the present embodiment includes a substrate 10 on which a pixel area PXL1, a transistor area TR1, a capacitor area CAP1, and a pad area PAD1 are provided.

The substrate 10 may be provided as not only a glass substrate but also a transparent substrate such as a plastic substrate including polyethylene terephthalate (PET), polyethylene naphthalate (PEN), polyimide, etc.

A buffer layer 11 may be provided on the substrate 10. The buffer layer 11 forms a smooth surface on an upper portion of the substrate 10 so as to prevent intrusion of impure elements. The buffer layer 11 may be formed of silicon nitride and/or silicon oxide as a single layer or multiple layers.

An active layer 212 is provided on the buffer layer 11. The active layer 212 may be formed of semiconductor including amorphous silicon or crystalline silicon. The active layer 212 may include a channel area 212c, and a source area 212a and a drain area 212b provided outside the channel area 212c and doped with ion impurities.

Gate electrodes 214 and 215 are provided on the active layer 212 at a position corresponding to the channel area 212c of the active layer 212 with a first insulation layer 13 that is a gate insulation layer and interposed between the active layer 212 and the gate electrodes 214 and 215. The gate electrodes 214 and 215 are sequentially provided with a first layer 214 including transparent conductive oxide and a second layer 215 including metal. The first layer 214 may include at least one selected from a group consisting of indium tin oxide (ITO), indium zinc oxide (IZO), zinc oxide (ZnO), indium oxide ($In_2O_3$), indium galium oxide (IGO), and aluminum zinc oxide (AZO). The second layer 215 may be formed of at least one metal selected from a group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), as a single layer or multiple layers.

A source electrode 217a and a drain electrode 217b respectively connected to a source area 212a and a drain area 212b of the active layer 212 are provided on the gate electrodes 214 and 215 with the second insulation layer 16 that is an interlayer dielectric interposed therebetween. The source and drain electrodes 217a and 217b may include the same material as the second layer 215 of the gate electrodes 214 and 215. For example, the source and drain electrodes 217a and 217b may be formed of at least one metal selected from a group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), as a single layer or multiple layers.

A protection layer 18 for preventing the source and drain electrodes 217a and 217b from being corroded by moisture and oxygen is provided on an upper surface of each of the source and drain electrodes 217a and 217b. Although FIG. 1 illustrates that the protection layer 18 is provided only on the upper surfaces of the source and drain electrodes 217a and 217b, the present invention is not limited thereto. The protection layer 18 may be formed on an upper surface of a wiring (not shown) that is formed on the same plane as the source and drain electrodes 217a and 217b. The protection layer 18 may include metal oxide or transparent conductive oxide. The transparent conductive oxide includes at least one selected from a group consisting of indium tin oxide (ITO), indium zinc oxide (IZO), zinc oxide (ZnO), indium oxide (In2O3), indium galium oxide (IGO), and aluminum zinc oxide (AZO).

A third insulation layer 19 is provided on the second insulation layer 16 to cover the source and drain electrodes 217a and 217b. In the present embodiment, the first and second insulation layers 13 and 16 are provided as an inorganic insulating layer, whereas the third insulation layer 19 may be provided as an organic insulating layer. The third insulation layer 19 may include common commercial polymer such as poly(methyl methacrylate) (PMMA) or polystyrene (PS), polymer derivatives having a phenol group, acrylic based polymer, imide based polymer, aryl ether based polymer, amide based polymer, fluorine based polymer, p-xylene based polymer, vinyl alcohol based polymer, and blends thereof.

A pixel electrode 114 including the same transparent conductive oxide as the first layer 214 of the gate electrodes 214 and 215 is formed on the substrate 10, the buffer layer 11, and the first insulation layer 13. The pixel electrode 114 may include at least one material selected from a group consisting of indium tin oxide (ITO), indium zinc oxide (IZO), zinc oxide (ZnO), indium oxide ($In_2O_3$), indium galium oxide (IGO), and aluminum zinc oxide (AZO).

The second insulation layer 16 is formed outside the pixel electrode 114. A first opening C1 for exposing the pixel electrode 114 is formed in the second insulation layer 16. The first opening C1 may be formed to be larger than the pixel electrode 114 such that a first gap G1 can be formed between an end portion of the pixel electrode 114 and an end portion of the second insulation layer 16.

The third insulation layer 19 is formed on the second insulation layer 16. A fourth opening C4 for exposing the pixel electrode 114 is formed in the third insulation layer 19. The end portion of the pixel electrode 114 and the end portion of the third insulation layer 19 may overlap each other.

An organic light emitting layer 120 is formed in the fourth opening C4. The organic light emitting layer 120 may be a low molecular organic material or a polymer organic material. When the organic light emitting layer 120 is a low molecular organic material, a hole transport layer (HTL), a hole injection layer (HIL), an electron transport layer (ETL), and an electron injection layer (EIL) may be stacked with respect to the organic light emitting layer 120. In addition, various layers may be stacked as necessary. A usable organic material may include copper phthalocyanine (CuPc), N'-Di (naphthalene-1-yl)-N,N'-diphenyl-benzidine (NPB), tris-8-hydroxyquinoline aluminum (Alq3), etc. When the organic light emitting layer 120 is a polymer organic material, an HTL may be included in addition to the organic light emitting layer 120. Poly-(3,4)-ethylene-dihydroxy thiophene (PEDOT), polyaniline (PANI), etc. may be used as the HTL. A usable organic material may include a polymer organic material such as poly-phenylenevinylene (PPV) based materials and polyfluorene based materials.

An opposed electrode 121 is stacked as a common electrode on the organic light emitting layer 120. The opposed electrode 121 may be formed as a reflection electrode including a reflection material. The opposed electrode 121 may include at least one material selected from a group consisting of aluminum (Al), magnesium (Mg), lithium (Li), calcium (Ca), LiF/Ca, and LiF/Al. As the opposed electrode 121 is provided as a reflection electrode, light irradiated from the organic light emitting layer 120 is reflected from the opposed electrode 121 and passes through the pixel electrode 114 formed of transparent conductive oxide to proceed toward the substrate 10.

Figure 8:
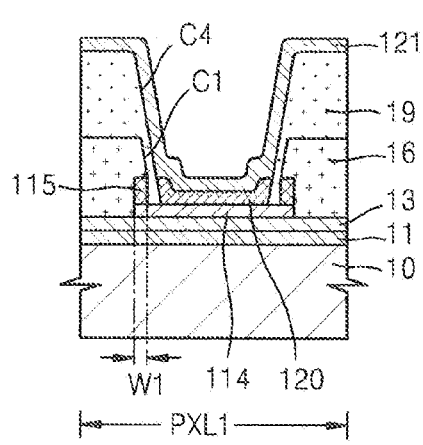
FIG. 8 is a cross-sectional view schematically illustrating a pixel area according to a comparative example of the present invention.

FIG. 8 is a cross-sectional view schematically illustrating a pixel area according to a comparative example of the present invention. Referring to FIG. 8, the pixel electrode 114 is provided on the substrate 10 and the first insulation layer 13. The end portion of the pixel electrode 114 overlaps the second insulation layer 16 by a predetermined width W1. Since the third insulation layer 19 covers the end portion of the pixel electrode 114 at the inner side than the first opening C1, an effective light emitting area defined by the fourth opening C4 is reduced.

However, in the present embodiment, since the first gap G1 is formed between the end portion of the pixel electrode 114 and the end portion of the second insulation layer 13, the area where the third insulation layer 19 overlaps the pixel electrode 114 may be reduced. Thus, as an effective light emitting area increases, an aspect ratio of a display device may be increased.

Referring back to FIG. 1, the first electrode 312, a second electrode 314, and the first insulation layer 13 arranged between the first and second electrodes 312 and 314 are provided in the capacitor area CAP1.

The first electrode 312 may include semiconductor doped with ion impurities as the same material as the source area 212a and the drain area 122b of the active layer 212 of a thin film transistor (TFT). When the first electrode 312 is formed of intrinsic semiconductor that is undoped with ion impurities, the capacitor has a metal oxide semiconductor (MOS) CAP structure. However, when the first electrode 312 is formed of semiconductor doped with ion impurities as in the present embodiment, a metal-insulator-metal (MIM) CAP structure having a capacitance larger than the MOS CAP structure so that the capacitance may be increased. Thus, as the MIM CAP structure realizes, the same capacitance with an area smaller than the MOS CAP structure, a margin to reduce an area of a capacitor increases so that the pixel electrode may be formed to be large and thus an aspect ratio may be increased. Also, as it will be described later, an area where ion impurities are doped is continuously distributed without a break in the first electrode 312 so that signal transmission quality of a capacitor may be improved.

The first insulation layer 13 functioning as an insulating layer is provided over an upper surface of the first electrode 312. The second electrode 314 including the same transparent conductive oxide as the first layer 214 of the gate electrodes 214 and 215 is provided on the first insulation layer 13.

The second insulation layer 16 is formed outside the second electrode 314. A third opening C3 for exposing the second electrode 314 is formed in the second insulation layer 16. The third opening C3 may be formed larger than the second electrode 314 such that a second gap G2 may be formed between the end portion of the second electrode 314 and the end portion of the second insulation layer 16.

The third insulation layer 19 is provided on the second electrode 314. The third insulation layer 19 may directly contact the first insulation layer 13 in the second gap G2. The third insulation layer 19 may be provided as an organic insulating layer. As the third insulation layer 19 that is an organic insulating layer having a low permittivity is provided between the opposed electrode 121 and the second electrode 314, parasitic capacitance that may be generated between the opposed electrode 121 and the second electrode 314 is reduced so that signal interference due to parasitic capacitance may be prevented.

Figure 9:
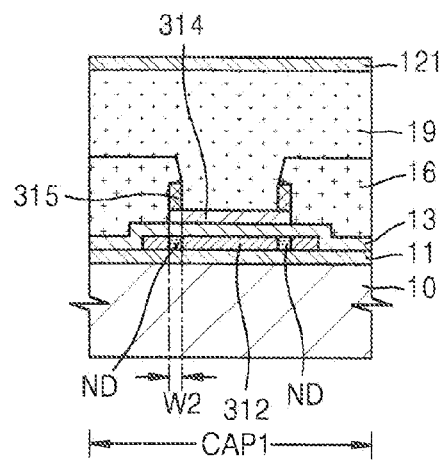
FIG. 9 is a cross-sectional view schematically illustrating a capacitor area according to a comparative example of the present invention.

FIG. 9 is a cross-sectional view schematically illustrating the capacitor area CAP1 according to a comparative example of the present invention. Referring to FIG. 9, the first electrode 312 is provided on the substrate 10. The second insulation layer 16 is provided on the first electrode 312. The end portion of the second electrode 314 overlaps the second insulation layer 16 by a predetermined width W2. Metal of an upper layer 315 of the second electrode 314 covered by the second insulation layer 16 remains without being etched on the second electrode 314 in an overlapping area. Since the upper layer 314 functions as a shield mask, a part ND of the first electrode 312 corresponding to the upper layer 314 is undoped with ion impurities. Thus, resistance of a capacitor increases and thus signal transmission quality is deteriorated.

However, in the present embodiment, the third opening C3 is formed larger than the second electrode 314 such that the second gap G2 may be formed between the end portion of the second electrode 314 and the end portion of the second insulation layer 13. Since in the present embodiment there is no overlap area between the second insulation layer 16 and the second electrode 314, the upper layer 315 does not remain on the second electrode 314. Thus, ion impurities are continuously doped into the first electrode 312 without a break so that signal transmission quality of a capacitor may be improved.

The pad area PAD1 where a pad electrode 417 that is a connection terminal of an external driver is disposed outside the organic light emitting display device 1. In the present embodiment, the pad electrode 417 may be formed of the same material as the source and drain electrodes 217a and 217b. The pad electrode 417 may include a plurality of metal layers having different electron mobility. For example, the pad electrode 417 may be formed of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), as a single layer or multiple layers.

Also, the pad electrode 417 is arranged on the same layer as the source and drain electrodes 217a and 217b. That is, the pad electrode 417 is arranged directly on the second insulation layer 16. Since the pad electrode 417 is formed later than the above-described gate electrodes 214 and 215, the pixel electrode 114, and the first and second electrodes 312 and 314, deterioration of reliability of the pad electrode 417 may be prevented during a process of forming the gate electrodes 214 and 215, the pixel electrode 114, and the first and second electrodes 312 and 314 on the pad electrode 417, or during a process of removing the above elements from the pad electrode 417.

The protection layer 18 is provided on an upper surface of the pad electrode 417. The protection layer 18 prevents the pad electrode 417 from being damaged by moisture and oxygen. The protection layer 18 may include metal oxide or transparent conductive oxide.

Although it is not illustrated in FIG. 1, the organic light emitting display device 1 according to the present embodiment may further include a sealing member (not shown) for sealing a display area including the pixel area PXL1, the capacitor area CAP1, and the transistor area TR1. The sealing member may be formed as a substrate including a glass material, a metal film, or a sealing thin film in which an organic insulating layer and an inorganic insulating layer are alternately arranged.

A method of manufacturing the organic light emitting display device 1 according to an embodiment of the present invention is now described below with reference to FIGS. 2 through 7.

Figure 2:
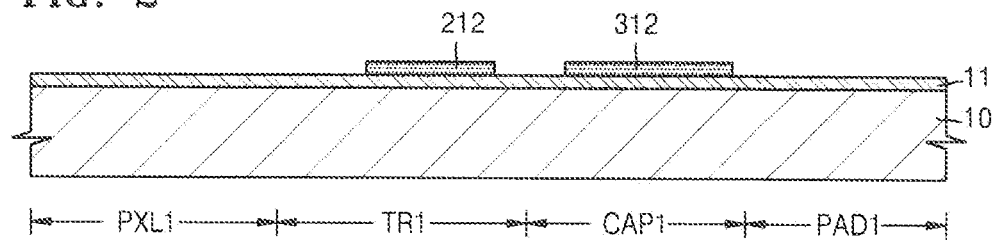
FIG. 2 is a cross-sectional view schematically illustrating a first mask process of the organic light emitting display device of FIG. 1.

FIG. 2 is a cross-sectional view schematically illustrating a first mask process of the organic light emitting display device 1 of FIG. 1. Referring to FIG. 2, the buffer layer 11 is formed on the substrate 10 and a semiconductor layer (not shown) is formed on the buffer layer 11. The semiconductor layer is patterned so that the active layer 212 of a TFT and the first electrode 312 of a capacitor are formed.

Although it is not illustrated in the above drawing, after photoresist (not shown) is coated on the semiconductor layer, the semiconductor layer is patterned by a photolithography process using a first photomask (not shown). As a result of the pattering, the above-described active layer 212 and the first electrode 312 are formed. The first mask process using photolithography is performed through a series of processes of developing, etching, striping, or ashing, etc. after the first photomask is exposed by an exposure apparatus (not shown).

The semiconductor layer may be formed of amorphous silicon or polysilicon. The polysilicon may be formed by crystallizing amorphous silicon. A method of crystallizing amorphous silicon may include various methods such as a rapid thermal annealing (RTA) method, a solid phase crystallzation (SPC) method, an excimer laser annealing (ELA) method, a metal induced crystallization (MIC) method, a metal induced lateral crystallization (MILC) method, and a sequential lateral solidification (SLS) method.

Figure 3:
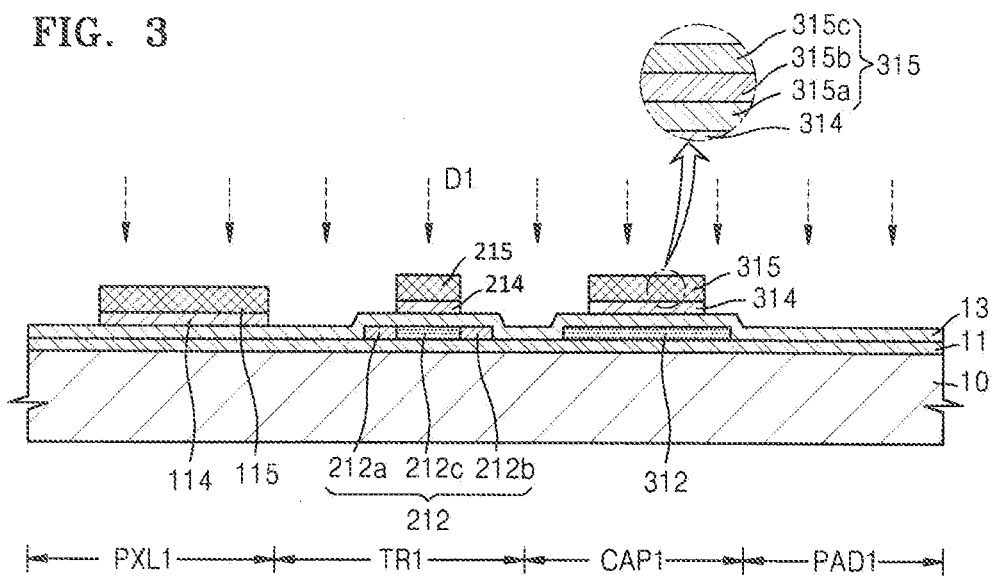
FIG. 3 is a cross-sectional view schematically illustrating a second mask process of the organic light emitting display device of FIG. 1.

FIG. 3 is a cross-sectional view schematically illustrating a result of a second mask process of the organic light emitting display device 1 of FIG. 1. Referring to FIG. 3, the first insulation layer 13 is formed on a resultant of the first mask process of FIG. 2. A transparent conductive oxide layer (not shown) and a first metal layer (not shown) are sequentially stacked on the first insulation layer 13 and then are patterned. As described above, the first metal layer may be formed of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), as a single layer or multiple layers.

As a result of the pattering, the gate electrodes 214 and 215, the second electrode 314 of a capacitor and the upper layer 315 of the second electrode 314, and the pixel electrode 114 and an upper layer 115 of the pixel electrode 114 are formed on the first insulation layer 13. In the present embodiment, the upper layer 315 of the second electrode 314 formed by patterning the first metal layer includes a first layer 315a including molybdenum (Mo), a second layer 315b including aluminum (Al), and a third layer 315c including molybdenum (Mo).

Ion impurities are first doped (D1) in the above-described structure. The ion impurities may be B or P ions and are doped at a concentration of $1 \times 10^{15}$ atoms/cm$^2$ or higher in a target structure of the active layer 212 of a TFT. By doping the ion impurities in the active layer 212 using the gate electrodes 214 and 215 as a self-align mask, the active layer 212 includes the source area 212a and the drain area 212b where the ion impurities are doped, and the channel area 212c therebetween.

Figure 4:
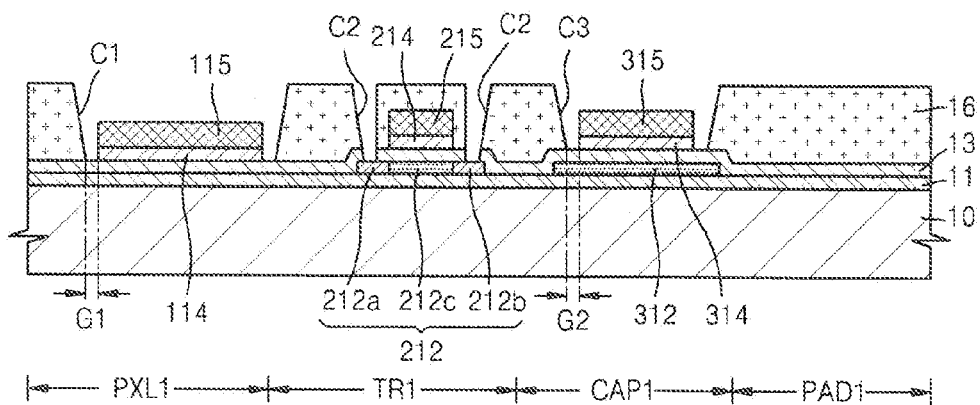
FIG. 4 is a cross-sectional view schematically illustrating a third mask process of the organic light emitting display device of FIG. 1.

FIG. 4 is a cross-sectional view schematically illustrating a result of a third mask process of the organic light emitting display device 1 of FIG. 1. Referring to FIG. 4, the second insulation layer 16 is formed on a resultant of the second mask process of FIG. 3. The first opening C1 for exposing the pixel electrode 114 and the upper layer 115 thereof, the second opening C2 for exposing the source area 212a and the drain area 212b of the active layer 212, and the third opening C3 for exposing the second electrode 314 and the upper layer 315 thereof are formed by patterning the second insulation layer 16. The first opening C1 forms the end portion of the pixel electrode 114 and the first gap G1, whereas the third opening C3 forms an end portion of the first electrode 314 and the second gap G2.

Figure 5:
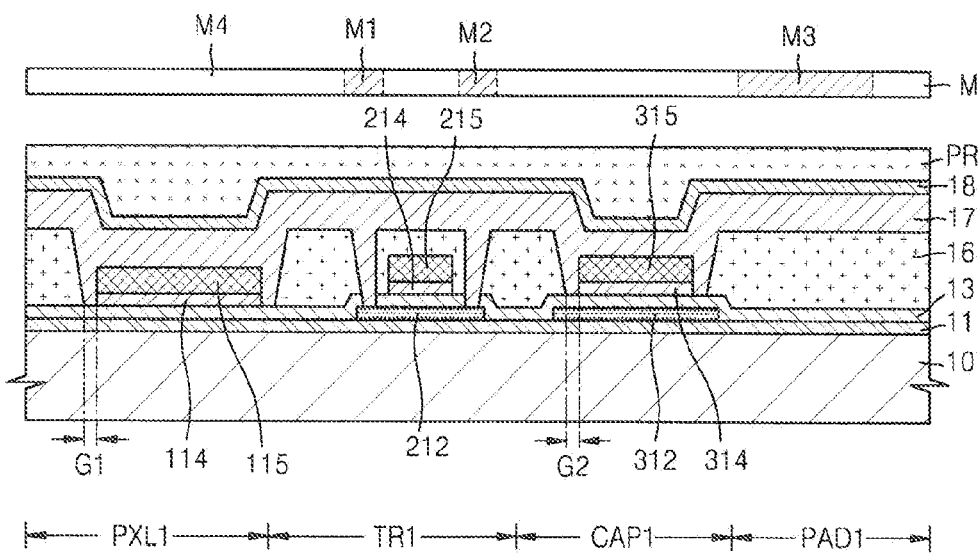
FIGS. 5 and 6 are cross-sectional views schematically illustrating a fourth mask process of the organic light emitting display device of FIG. 1.
Figure 6:
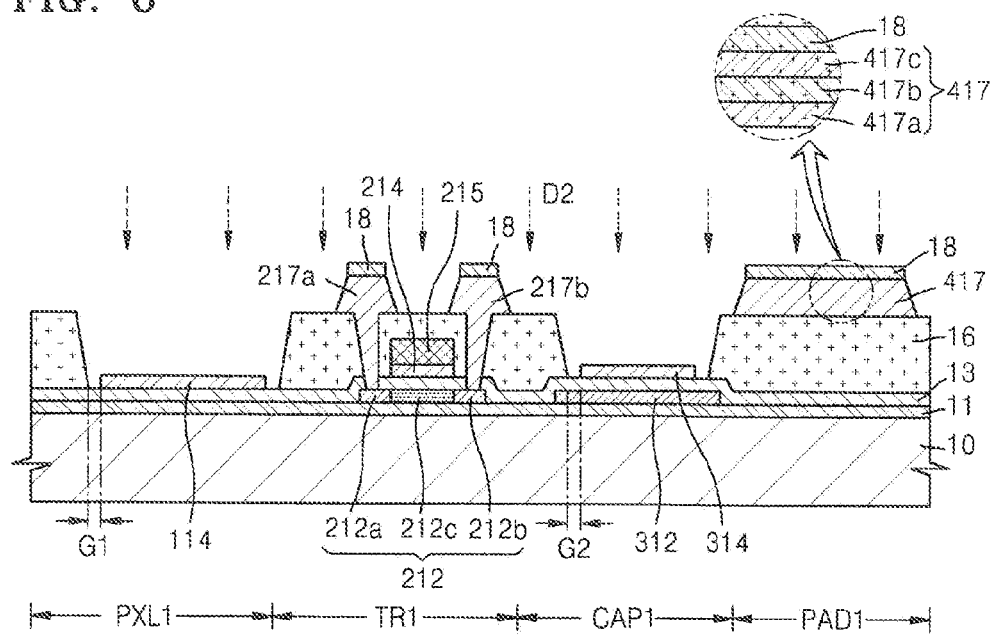

FIGS. 5 and 6 are cross-sectional views schematically illustrating a result of a fourth mask process of the organic light emitting display device 1 of FIG. 1. Referring to FIG. 5, a mask M having light shielding portions M1, M2, and M3 and a light transmission portion M4 is provided. A second metal layer 17, the protection layer 18, and photoresist PR are sequentially formed on a resultant of the third mask process of FIG. 4.

Referring to FIG. 6, an area corresponding to the light transmission portion M4, that is, the upper layer 115, the second metal layer 17, and the protection layer 18 on the pixel electrode 114, and the upper layer 315, the second metal layer 17, and the protection layer 18 on the second electrode 314, are removed. Meanwhile, the second metal layer 17 and the protection layer 18 in an area corresponding to the light shielding portions M1, M2, and M3 are patterned so that the source and drain electrodes 217a and 217b provided with the protection layer 18, and the pad electrode 417, are formed.

The second metal layer 17 may be formed of a plurality of metal layers having different electron mobility. In the present embodiment, the pad electrode 417 formed by patterning the second metal layer 17 includes a first layer 417a including molybdenum (Mo), a second layer 417b including aluminum (Al), and a third layer 417c including molybdenum (Mo). The protection layer 18 is patterned with the second metal layer 18 in the same mask process so that the source and drain electrodes 217a and 217b and the pad electrode 417 are prevented from being damaged by moisture and oxygen.

After the upper layer 115, the second metal layer 17, and the protection layer 18 on the pixel electrode 114, and the upper layer 315, the second metal layer 17, and the protection layer 18 on the second electrode 314, are removed, a second doping process (D2) is performed on a target of the second electrode 314. The first electrode 312 that is undoped in the first doping D1 is doped with ion impurities after the second doping D2, thereby forming an MIM CAP with the second electrode 314. Also, the ion impurities are continuously doped without a break due to the second gap G2 formed between the end portion of the second electrode 314 and the end portion of the second insulation layer 16 so that the deterioration of signal transmission quality of a capacitor may be prevented.

Although it is not illustrated in detail in FIG. 6, a data wiring may be formed together by patterning the second metal layer 17 and the protection layer 18 in the fourth mask process.

Figure 7:
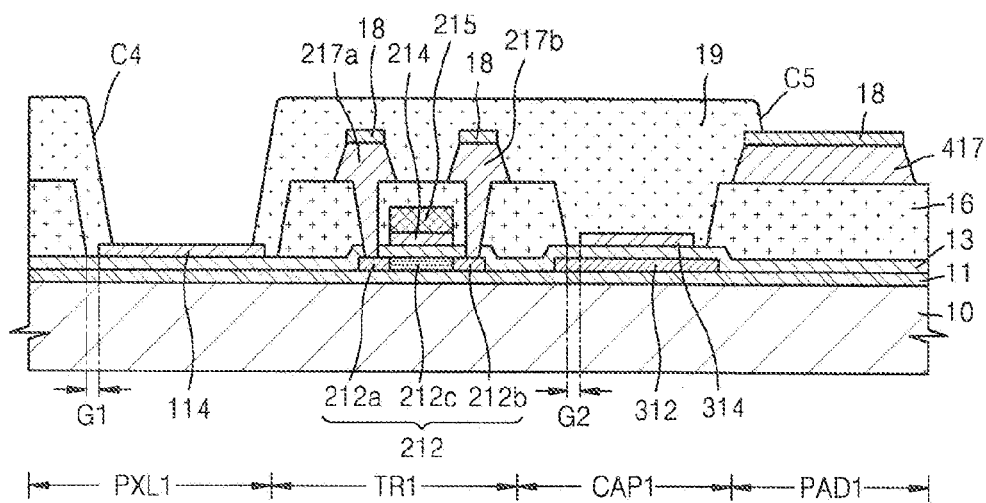
FIG. 7 is a cross-sectional view schematically illustrating a fifth mask process of the organic light emitting display device of FIG. 1.

FIG. 7 is a cross-sectional view schematically illustrating a result of a fifth mask process of the organic light emitting display device 1 of FIG. 1. Referring to FIG. 7, the third insulation layer 19 is formed on a resultant of the fourth mask process of FIG. 6 and then the fourth opening C4 for exposing an upper surface of the pixel electrode 114 and a fifth opening C5 for exposing the pad electrode 417 are formed. As described above, since the first gap G1 is formed between the end portion of the pixel electrode 114 and the end portion of the second insulation layer 13, the area where the third insulation layer 19 and the pixel electrode 114 are overlapped with each other may be reduced. Thus, as an effective light emitting area increases, an aspect ratio of the display device may be increased.

The organic light emitting layer 120 is formed on the pixel electrode 114 after the fifth mask process. The opposed electrode 121 of FIG. 1 that is a common electrode is formed on the organic light emitting layer 120, thereby forming the organic light emitting display device 1. Also, a sealing member (not shown) may be further formed on the opposed electrode 121.

An organic light emitting display device 2 according to another embodiment of the present invention is now described below with reference to FIGS. 10 through 13. In the following description, only a difference from the organic light emitting display device 1 according to the above-described embodiment will be mainly discussed.

Figure 10:
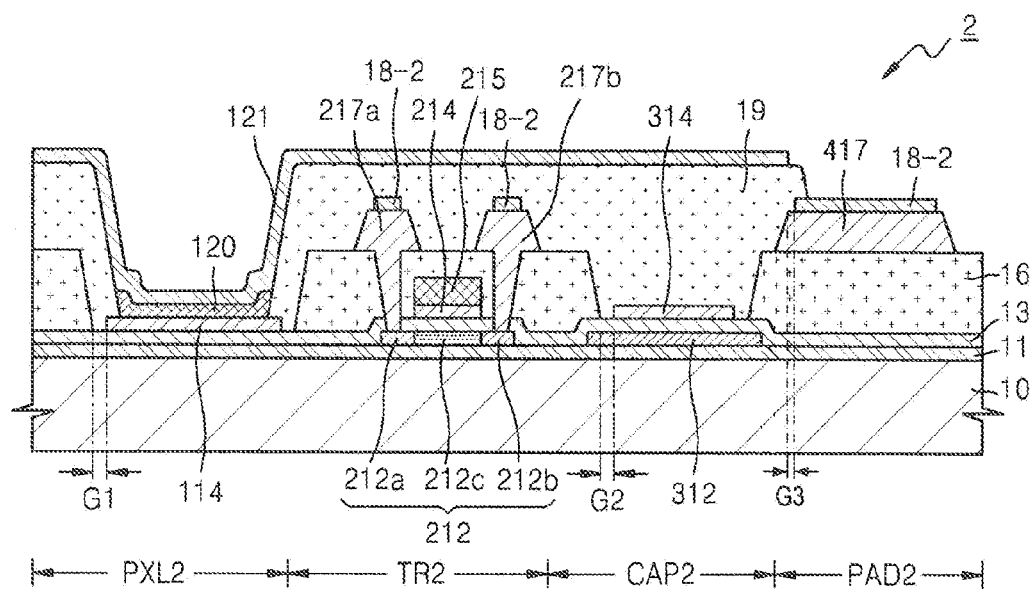
FIG. 10 is a cross-sectional view schematically illustrating an organic light emitting display device according to another embodiment of the present invention.

FIG. 10 is a cross-sectional view schematically illustrating an organic light emitting display device 2 according to another embodiment of the present invention. Referring to FIG. 10, a pixel area PXL2, a transistor area TR2, a capacitor area CAP2, and a pad area PAD2 are formed on the substrate 10 of the organic light emitting display device 2 of the present embodiment. In the present embodiment, the structures of the pixel area PXL2 and the capacitor area CAP2 are the same as those of the organic light emitting display device 1 according to the above-described embodiment.

A protection layer 18-2 is formed on an upper surface of the pad electrode 417 in the pad area PAD2. A third gap G3 is formed between an end portion of the pad electrode 417 and an end portion of the protection layer 18-2. That is, the end portion of the protection layer 18-2 is formed inwardly compared to the end portion of the pad electrode 417 so that the third insulation layer 19 may directly contact the upper surface of the pad electrode 417 in the third gap G3.

The end portion of the protection layer 18 of the above-described embodiment of FIG. 1 is illustrated to match the end portion of the pad electrode 417. However, since etch rates of materials for forming the protection layer 18 and the pad electrode 417 are different from each other, the end portion of the protection layer 18 may actually protrude outside the pad electrode 417. A protruding part of the protection layer 18 may be broken into particles during a process so that a particle defect may be generated.

Since the end portion of the protection layer 18-2 is formed inwardly compared to the end portion of the pad electrode 417, step coverage is improved. Also, since a surface area of the pad electrode 417 directly contacting the third insulation layer 19 that is an organic insulating layer increases, an adhesive force between the third insulation layer 19 and the pad electrode 417 is reinforced so that reliability of the pad electrode 417 may be improved.

In the transistor area TR2, the protection layer 18-2 is formed on upper surfaces of the source and drain electrodes 217a and 217b, so that particle defect may be prevented as in the above-described protection layer 18-2 on the pad electrode 417.

A method of manufacturing the organic light emitting display device 2 of FIG. 10 is described below with reference to FIGS. 11 through 13.

Figure 11:
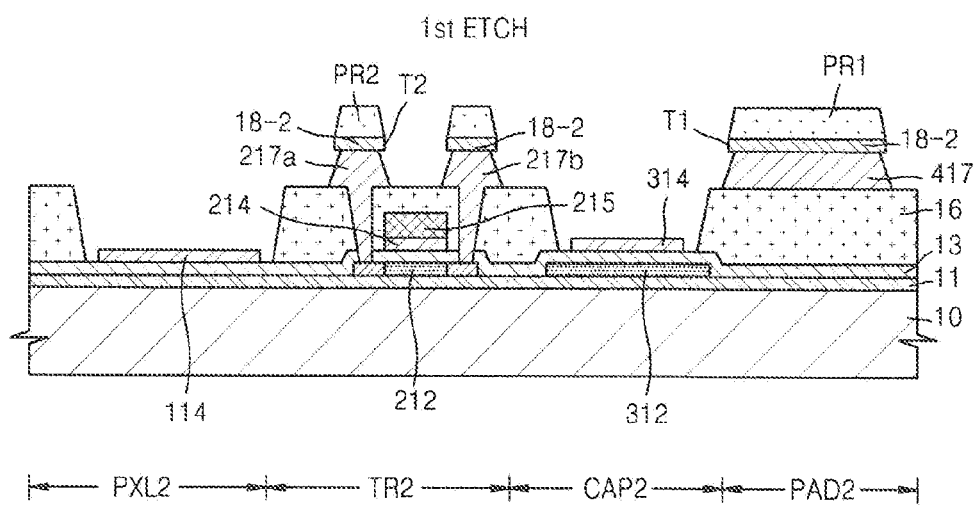
FIG. 11 is a cross-sectional view schematically illustrating a first etch process of a fourth mask process of the organic light emitting display device of FIG. 10.
Figure 12:
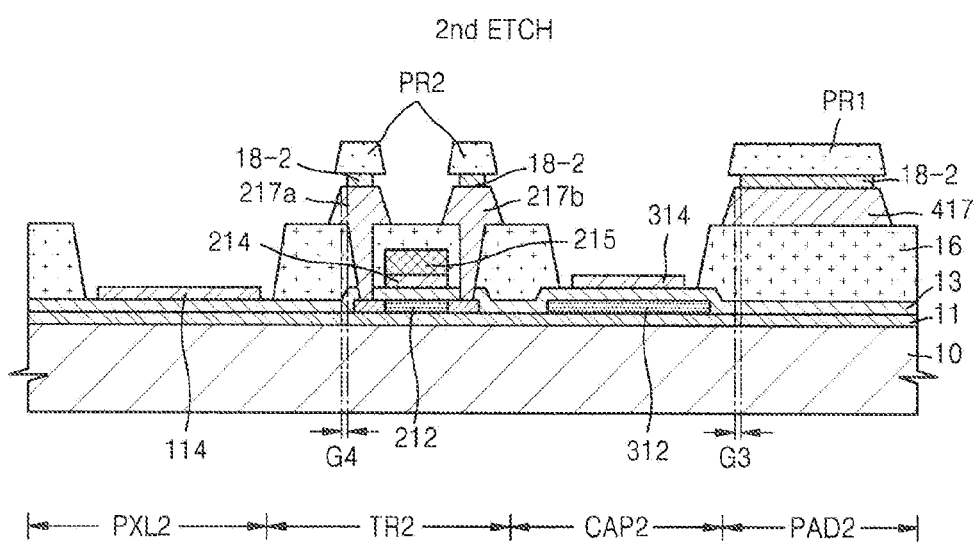
FIG. 12 is a cross-sectional view schematically illustrating a second etch process of the fourth mask process of the organic light emitting display device of FIG. 10.
Figure 13:
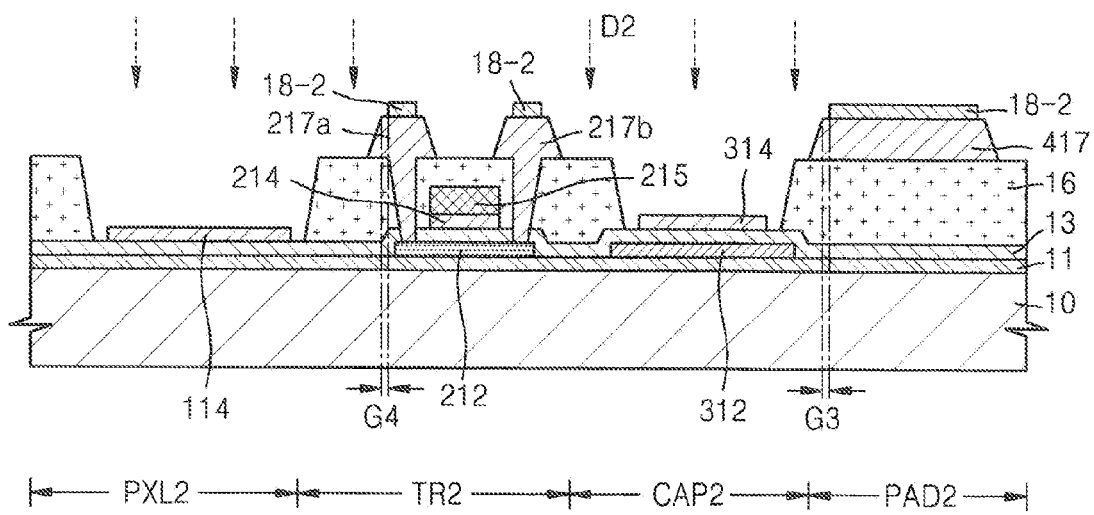
FIG. 13 is a cross-sectional view schematically illustrating a second doping process of the fourth mask process of the organic light emitting display device of FIG. 10.

FIGS. 11 through 13 mainly illustrate the fourth mask process of the organic light emitting display device 2. The first through third mask processes and the fifth mask process of the present embodiment that are not illustrated in the drawings are the same as those of the above-described embodiment.

FIG. 11 is a cross-sectional view schematically illustrating a first etch process of a fourth mask process of the organic light emitting display device 2 of FIG. 10. FIG. 12 is a cross-sectional view schematically illustrating a second etch process of the fourth mask process of the organic light emitting display device 2 of FIG. 10.

Referring to FIG. 11, the upper layer 115 (see FIG. 5), the second metal layer 17 (see FIG. 5), and the protection layer 18 (see FIG. 5) on and above the pixel electrode 114, and the upper layer 315 (see FIG. 5), the second metal layer 17 (see FIG. 5), and the protection layer 18 (see FIG. 5) on and above the second electrode 314, are removed by the first etch process ($1^{st}$ ETCH). In the meantime, photoresist PR1 and PR2 remain in an area corresponding to the light shielding portions M1, M2, and M3 (see FIG. 5). The pad electrode 417 and the source and drain electrodes 217a and 217b are respectively formed under the photoresist PR1 and PR2. The protection layer 18-2 is formed between the pad electrode 417 and the source and drain electrodes 217a and 217b, and the photoresist PR1 and PR2.

Since the etch rates of the protection layer 18-2 and the source and drain electrodes 217a and 217b are different from each other, the end portion of the protection layer 18-2 forms a tip T2 protruding from the end portion of each of the source and drain electrodes 217a and 217b. Also, since the etch rates of the protection layer 18-2 and the pad electrode 417 are different from each other, the end portion of the protection layer 18-2 forms a tip T1 protruding from the end portion of the pad electrode 417. If the etch process is completed by one time only as in the above-described embodiment, the tips T1 and T2 of the protection layer 18-2 are left after the photoresist PR1 and PR2 are removed. The tips T1 and T2 may be broken into particles during a process so that a particle defect may be generated.

Referring to FIG. 12, the protection layer 18-2 is etched again by a second etch process ($2^{nd}$ ETCH). In doing so, an etchant to which oxalic acid or anti-metal corrosion agent is added may be used. The tip T1 of the protection layer 18-2 forms the third gap G3 with the end portion of the pad electrode 417 by the second etch process. The tip T2 of the protection layer 18-2 forms a fourth gap G4 with the end portion of each of the source and drain electrodes 217a and 217b. After the second etch process, the photoresist PR1 and PR2 remaining on the protection layer 18-2 are removed.

FIG. 13 is a cross-sectional view schematically illustrating a second doping process of the fourth mask process of the organic light emitting display device 2 of FIG. 10. Referring to FIG. 13, the second doping D2 process is performed with a target of the first electrode 312. The first electrode 312 is doped with ion impurities and forms an MIM CAP with the second electrode 314. If the second doping D2 is performed in a state in which the tips T1 and T2 of the protection layer 18-2 are not removed by performing the first etch process only as in the above-described embodiment, static electricity is accumulated in the tips T1 and T2 so that discharge may be generated thereby. However, in the present embodiment, since the tips T1 and T2 of the protection layer 18-2 are removed, a defect due to the static electricity and discharge may be prevented.

As described above, the thin film transistor array substrate according to the present invention, an organic light emitting display device comprising the thin film transistor array substrate, and a method of manufacturing the thin film transistor array substrate have the following effects.

First, a protection layer is formed on a pad electrode so that corrosion of the pad electrode may be prevented.

Second, a protruding portion of the protection layer is removed so that contamination due to particles of the protruding portion may be prevented.

Third, an end portion of the protection layer is formed inwardly compared to an end portion of the pad electrode so that a defect due to the generation of static electricity by doping may be prevented.

Fourth, the end portion of the protection layer is formed inwardly compared to the end portion of the pad electrode so that step coverage may be enhanced.

Fifth, the end portion of the protection layer is formed inwardly compared to the end portion of the pad electrode so that an adhesive force between a pixel define layer and the pad electrode may be reinforced.

Sixth, a phenomenon that ion impurities are undoped in a capacitor lower electrode is removed so that capacitance is increased and signal transfer quality of a capacitor wiring may be improved.

Seventh, an aspect ratio may be improved.

Eighth, a thin film transistor array substrate and an organic light emitting display device may be manufactured by the fifth mask process.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A thin film transistor array substrate, comprising:
a capacitor comprising a first electrode and a second electrode;
a thin film transistor comprising
an active layer, a gate electrode, and source and drain electrodes,
a first insulation layer arranged between the active layer and the gate electrode, and
a second insulation layer arranged between the gate electrode and the source and drain electrodes;
a pixel electrode arranged on the first insulation layer and comprising a same material as the gate electrode;
a pad electrode arranged on the second insulation layer and comprising a same material as the source and drain electrodes;
a protection layer formed on the pad electrode, the protection layer and the pad electrode are formed from different layers; and
a third insulation layer formed on a portion of the protection layer and exposing another portion of the protection layer and the pixel electrode;
the first electrode of the capacitor and the active layer of the thin film transistor are formed from same layer,
the second electrode of the capacitor and the gate electrode of the thin film transistor are formed from same layer,
the pad electrode being spaced apart from and not overlapping the pixel electrode, the electrodes of the capacitor and the thin film transistor.

2. The thin film transistor array substrate of claim 1, the active layer comprises a semiconductor material doped with ion impurities.

3. The thin film transistor array substrate of claim 1, the pixel electrode comprises transparent conductive oxide.

4. The thin film transistor array substrate of claim 3, the transparent conductive oxide comprises at least one selected from a group consisting of indium tin oxide (ITO), indium zinc oxide (IZO), zinc oxide (ZnO), indium oxide (In2O3), indium gallium oxide (IGO), and aluminum zinc oxide (AZO).

5. The thin film transistor array substrate of claim 1, the first electrode comprises a semiconductor material doped with ion impurities.

6. The thin film transistor array substrate of claim 1, a gap is formed between an end portion of the pixel electrode and an end portion of the second insulation layer.

7. The thin film transistor array substrate of claim 1, an end portion of the pixel electrode and an end portion of the third insulation layer overlapped each other.

8. The thin film transistor array substrate of claim 1, a gap is formed between an end portion of the second electrode and an end portion of the second insulation layer.

9. The thin film transistor array substrate of claim 8, the third insulation layer contacts the first insulation layer in the gap.

10. The thin film transistor array substrate of claim 1, the protection layer is further formed on the source electrode and the drain electrode.

11. The thin film transistor array substrate of claim 1, the pad electrode comprises a plurality of metal layers having different electron mobility.

12. The thin film transistor array substrate of claim 11, the plurality of metal layers comprise a layer including molybdenum (Mo) and a layer including aluminum (Al).

13. The thin film transistor array substrate of claim 1, the protection layer comprises metal oxide or transparent conductive oxide.

14. The thin film transistor array substrate of claim 13, the transparent conductive oxide comprises at least one selected from a group consisting of indium tin oxide (ITO), indium zinc oxide (IZO), zinc oxide (ZnO), indium oxide (In2O3), indium gallium oxide (IGO), and aluminum zinc oxide (AZO).

15. The thin film transistor array substrate of claim 1, further comprised of a gap formed between an end portion of the pad electrode and an end portion of the protection layer.

16. The thin film transistor array substrate of claim 15, further comprised of the third insulation layer directly contacting an upper surface of the pad electrode in the gap.

17. The thin film transistor array substrate of claim 1, the gate electrode comprises a first layer including transparent conductive oxide and a second layer including metal.

18. The thin film transistor array substrate of claim 1, the gate electrode and the source and drain electrodes comprise the same material.

19. An organic light emitting display device, comprising:
a capacitor comprising a first electrode and a second electrode;
a thin film transistor comprising
an active layer, a gate electrode, and source and drain electrodes,
a first insulation layer arranged between the active layer and the gate electrode, and
a second insulation layer arranged between the gate electrode and the source and drain electrodes;
a pixel electrode arranged on the first insulation layer and comprising a same material as the gate electrode;
a pad electrode positioned to receive an image signal from a source external to the transistor, arranged on the second insulation layer and comprising the same material as the source and drain electrodes;
a protection layer formed on the pad electrode, the protection layer and the pad electrode are formed from different layers;
a third insulation layer formed on a portion of the protection layer and exposing another portion of the protection layer and the pixel electrode;
an organic light emitting layer arranged on the pixel electrode; and
an opposed electrode arranged on the organic light emitting layer;
the first electrode of the capacitor and the active layer of the thin film transistor are formed from same layer,
the second electrode of the capacitor and the gate electrode of the thin film transistor are formed from same layer, and
the pad electrode being spaced apart from and not overlapping the pixel electrode, the electrodes of the capacitor and the thin film transistor.

20. The organic light emitting display device of claim 19, the opposed electrode is a reflection electrode for reflecting light irradiated from the organic light emitting layer.

* * * * *